United States Patent
Kusunoki et al.

(10) Patent No.: US 9,099,572 B2
(45) Date of Patent: Aug. 4, 2015

(54) SEMICONDUCTOR LIGHT EMITTING ELEMENT AND METHOD OF MANUFACTURING SEMICONDUCTOR LIGHT EMITTING ELEMENT

(71) Applicant: TOYODA GOSEI CO., LTD., Kiyosu-shi, Aichi-ken (JP)

(72) Inventors: Katsuki Kusunoki, Ichihara (JP); Hisao Sato, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

(21) Appl. No.: 14/132,248

(22) Filed: Dec. 18, 2013

(65) Prior Publication Data

US 2014/0209921 A1   Jul. 31, 2014

(30) Foreign Application Priority Data

Jan. 25, 2013   (JP) ................. 2013-012242

(51) Int. Cl.
*H01L 29/80* (2006.01)
*H01L 31/0288* (2006.01)
*H01L 31/112* (2006.01)
*H01L 33/00* (2010.01)
*H01L 33/06* (2010.01)
*H01L 33/24* (2010.01)

(52) U.S. Cl.
CPC .............. *H01L 33/007* (2013.01); *H01L 33/06* (2013.01); *H01L 33/24* (2013.01)

(58) Field of Classification Search
CPC .... H01L 33/32; H01L 33/0075; H01L 33/007
USPC ............................................. 257/76; 438/47
See application file for complete search history.

(56) References Cited

U.S. PATENT DOCUMENTS 8,828,752 B2 * 9/2014 Ting .................................. 438/22

FOREIGN PATENT DOCUMENTS

JP   2011-222812 A   11/2011

* cited by examiner

*Primary Examiner* — David S Blum
(74) *Attorney, Agent, or Firm* — Sughrue Mion, PLLC (57) ABSTRACT

A semiconductor light emitting element includes: an n-type semiconductor layer; a light emitting layer alternately laminating plural barrier layers and plural well layers; and a p-type semiconductor layer, wherein the light emitting layer includes three or more well layers and four or more barrier layers, each well layer being sandwiched by the barrier layers, one barrier layer contacting the n-type semiconductor layer, and another barrier layer contacting the p-type semiconductor layer, the well layers include plural n-side well layers from the n-type semiconductor layer side and one p-side well layer on the p-type semiconductor layer side, and a V-shaped concave portion including inclined surfaces is generated in the light emitting layer, and in at least one of the n-side well layers, a concentration of atoms of In on the inclined surface is not more than 50% of a concentration of atoms of In in the n-side well layer.

7 Claims, 7 Drawing Sheets

GROWTH OF LAYER WITH 4-MINUTES SUSPENSION
(In NORMALIZATION WITH 50nm REFERENCE)

| LOCATION | 0 nm | 25 nm | 50 nm |
|---|---|---|---|
| WELL LAYER A | 0.35 | 1.13 | 1.00 |
| WELL LAYER B | 0.45 | 1.05 | 1.00 |
| WELL LAYER C | 0.47 | 0.82 | 1.00 |
| WELL LAYER D | 0.41 | 0.83 | 1.00 |
| WELL LAYER E | 0.37 | 0.83 | 1.00 |
| WELL LAYER F | 0.32 | 0.85 | 1.00 |
| BARRIER LAYER G | 0.07 | 0.07 | 0.07 |

FIG.5B

GROWTH OF LAYER WITHOUT SUSPENSION
(In NORMALIZATION WITH 50nm REFERENCE)

| LOCATION | 0 nm | 25 nm | 50 nm |
|---|---|---|---|
| WELL LAYER A | 0.35 | 1.02 | 1.00 |
| WELL LAYER B | 0.51 | 0.91 | 1.00 |
| WELL LAYER C | 0.58 | 0.91 | 1.00 |
| WELL LAYER D | 0.60 | 0.91 | 1.00 |
| WELL LAYER E | 0.60 | 0.91 | 1.00 |
| WELL LAYER F | 0.60 | 0.91 | 1.00 |
| BARRIER LAYER G | 0.07 | 0.07 | 0.06 |

FIG.6

FIG.7 ions that are generated in single crystal films deposited on a substrate and has good light emission properties, and a method of manufacturing the same.

SEMICONDUCTOR LIGHT EMITTING ELEMENT AND METHOD OF MANUFACTURING SEMICONDUCTOR LIGHT EMITTING ELEMENT

CROSS REFERENCE TO RELATED APPLICATIONS

This application is based on and claims priority under 35 USC §119 from Japanese Patent Application No. 2013-012242 filed Jan. 25, 2013, incorporated herein by reference in its entirety.

BACKGROUND

1. Technical Field

The present invention relates to a semiconductor light emitting element using a group III nitride semiconductor and a method of manufacturing the semiconductor light emitting element.

2. Related Art

In general, a semiconductor light emitting element using a group III nitride semiconductor is formed by arranging a light emitting layer using the group III nitride semiconductor between an n-type of group III nitride semiconductor layer containing n-type impurities for generating electrons as a carrier and a p-type of group III nitride semiconductor layer containing p-type impurities for generating holes as a carrier. In a semiconductor light emitting element in this type, the light emitting layer is configured with a multiple quantum well structure in which plural well layers and plural barrier layers are alternately laminated (refer to Japanese Patent Application Laid-Open Publication No. 2011-222812).

Incidentally, in manufacturing of the semiconductor light emitting element, if a gallium nitride-based semiconductor is grown on a substrate composed of a different material, such as sapphire, there are generated lots of threading dislocations resulting from lattice misfit, and further, V-pits are formed corresponding to the threading dislocations. At this time, if there are many defects that pass through laminated single crystal films, light emission properties as a light emitting element are largely deteriorated, and specifically, a reverse current (IR) is increased.

It is an object of the present invention to provide a semiconductor light emitting element using a group III nitride semiconductor which allows defects such as the threading dislocations that are generated in single crystal films deposited on a substrate and has good light emission properties, and a method of manufacturing the same.

SUMMARY

According to an aspect of the present invention, there is provided a semiconductor light emitting element including: an n-type semiconductor layer laminated on a substrate; a light emitting layer laminated on the n-type semiconductor layer and having a multiple quantum well structure in which plural barrier layers and plural well layers containing atoms of In are alternately laminated; and a p-type semiconductor layer laminated on the light emitting layer, wherein the light emitting layer includes three or more of the well layers and four or more of the barrier layers, each of the three or more well layers being sandwiched by the barrier layers from both sides, one of the four or more barrier layers being connected to the n-type semiconductor layer at an interface portion with the n-type semiconductor layer, and another one of the four or more barrier layers being connected to the p-type semiconductor layer at an interface portion with the p-type semiconductor layer, the three or more well layers include plural n-side well layers provided in order from a side closer to the n-type semiconductor layer and one p-side well layer provided on a side closer to the p-type semiconductor layer, and a V-shaped concave portion, which is configured with inclined surfaces of a concave portion opened toward the p-type semiconductor layer, is generated in the light emitting layer, and in at least one of the n-side well layers, a concentration of atoms of In on the inclined surface is not more than 50% of a concentration of atoms of In existing in the same n-side well layer.

Here, it is preferable that, in at least one of the n-side well layers, the concentration of atoms of In at a location of 25 nm from the inclined surface is not more than 90% of the concentration of atoms of In existing in the same n-side well layer.

It is preferable that the concentration of atoms of In on the inclined surface in the n-side well layer is reduced on the inclined surface in one of the n-side well layers closest to the n-type semiconductor layer compared to the concentration of atoms of In on the inclined surface in one of the n-side well layers closest to the p-type semiconductor layer.

It is preferable that the light emitting layer includes six layers of the well layer configured with a group III nitride semiconductor and seven layers of the barrier layer configured with a group III nitride semiconductor having band gap energy larger than that in the well layer.

It is preferable that the well layer is composed of $Ga_{1-y}In_yN$ (0.1<y<0.3) and the barrier layer is composed of GaN.

It is preferable that the barrier layer has a three-layer structure including an n-side low-temperature barrier layer grown on the n-type semiconductor layer side at a first temperature, a high-temperature barrier layer grown on the n-side low-temperature barrier layer at a second temperature that is higher than the first temperature, and a p-side low-temperature barrier layer grown on the high-temperature barrier layer at a third temperature that is lower than the second temperature.

Next, according to another aspect of the present invention, there is provided a method of manufacturing a semiconductor light emitting element, the method including: a first process for laminating an n-type semiconductor layer on a substrate; a second process for laminating a light emitting layer on the n-type semiconductor layer by a metal organic chemical vapor deposition device, the light emitting layer having a multiple quantum well structure in which barrier layers and well layers containing GaInN are alternately laminated, and the light emitting layer having a V-shaped concave portion resulting from a threading dislocation generated in the n-type semiconductor layer; and a third process for laminating a p-type semiconductor layer on the light emitting layer, wherein the second process includes, when the barrier layers are formed, an operation of supplying a raw material to the metal organic chemical vapor deposition device to grow an n-side low-temperature barrier layer with a substrate temperature at a first growth temperature, next, an operation of increasing the substrate temperature to a second growth temperature that is higher than the first growth temperature, while supply of the raw material is continued, to grow a high-temperature barrier layer on the n-side low-temperature barrier layer, subsequently, an operation of suspending supply of the raw material and lowering the substrate temperature to a third growth temperature that is lower than the second growth temperature, and while supply of the raw material remains suspended, maintaining the substrate at the third growth temperature for a time, which is at least 0.3 times as long as a time required to grow the n-side low-temperature barrier layer, and thereafter, restarting supply of the raw material to grow a p-side low-temperature barrier layer on the high-temperature barrier layer, and further, an operation of growing the well layer on the p-side low-temperature barrier layer.

Here, in the second process, a sum of a time for suspending supply of the raw material and lowering the substrate temperature from the second growth temperature to the third growth temperature and a time for maintaining the substrate at the third growth temperature while supply of the raw material remains suspended is at least 1.8 times as long as a time required to grow the n-side low-temperature barrier layer.

According to the present invention, it is possible to obtain a semiconductor light emitting element using a group III nitride semiconductor which allows defects such as the threading dislocations that are generated in single crystal films deposited on a substrate and has good light emission properties, and a method of manufacturing the same.

BRIEF DESCRIPTION OF THE DRAWINGS

An exemplary embodiment of the present invention will be described in detail based on the following figures, wherein.

DETAILED DESCRIPTION

Hereinafter, exemplary embodiments according to the present invention will be described in detail. It should be noted that the present invention is not limited to the following exemplary embodiments, but may be practiced as various modifications within the scope of the gist of the invention. In other words, unless otherwise specified, dimensions, materials, shapes or relative arrangement of components described in the specific examples of the exemplary embodiments do not purport to limit the scope of the present invention, but are merely descriptive specific examples. Further, each of the figures to be used indicates a specific example for illustration of each exemplary embodiment, and does not represent an actual size thereof. Moreover, in this specification, a phrase such as "the layer A formed above (over) the layer B" not only means the case where the layer A is formed above (over) the layer B with a separation therebetween, but also includes the case where the layer A is formed above (over) the layer B with some layer being interposed therebetween.

<Semiconductor Light Emitting Element>

Figure 1:
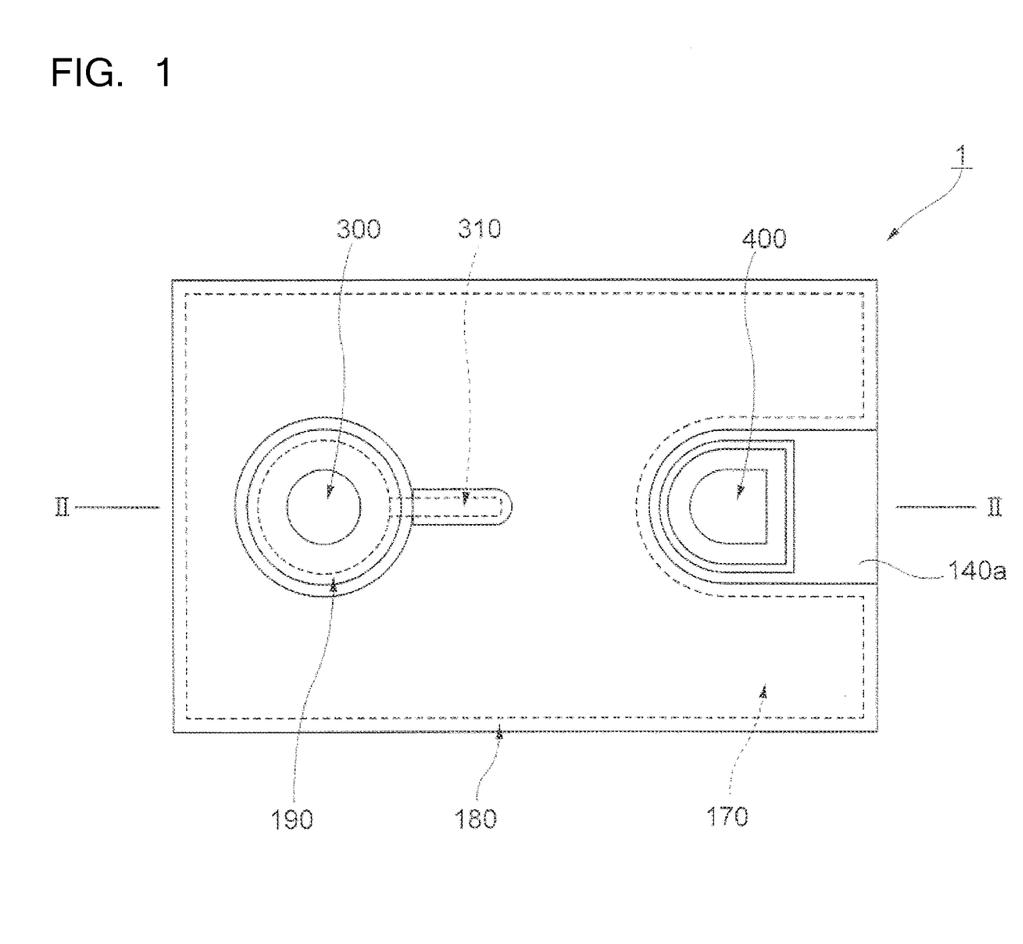
FIG. 1 is a specific example of a top view showing a semiconductor light emitting element to which an exemplary embodiment is applied.
Figure 2:
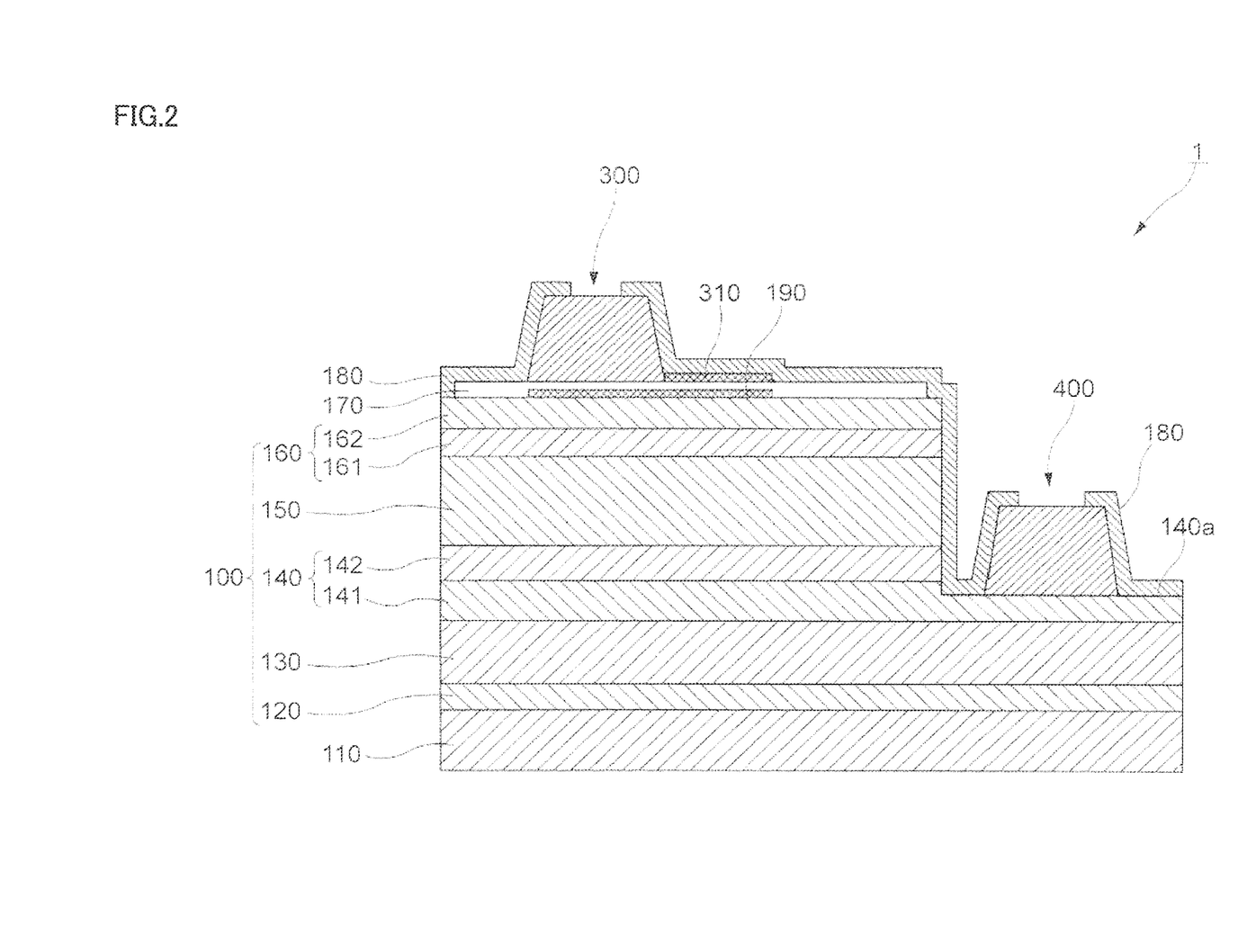
FIG. 2 is a II-II cross-sectional view in FIG. 1.

FIG. 1 is a specific example of a top view showing a semiconductor light emitting element (a light emitting diode) 1 to which the exemplary embodiment is applied, and FIG. 2 is a II-II cross sectional view of the semiconductor light emitting element 1 shown in FIG. 1.

The semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150.

Here, the n-type semiconductor layer 140 includes an n-contact layer 141 laminated on the base layer 130 and an n-cladding layer 142, which is laminated on the n-contact layer 141 and on which the light emitting layer 150 is laminated.

On the other hand, the p-type semiconductor layer 160 includes a p-cladding layer 161 laminated on the light emitting layer 150 and a p-contact layer 162 laminated on the p-cladding layer 161. It should be noted that, in the following description, these intermediate layer 120, base layer 130, n-type semiconductor layer 140, light emitting layer 150 and p-type semiconductor layer 160 will be collectively referred to as a laminated semiconductor layer 100 in some cases as necessary.

The semiconductor light emitting element 1 includes a transparent conductive layer 170 laminated on the p-type semiconductor layer 160 (more specifically, on the p-contact layer 162), a p-side electrode 300 laminated on part of the transparent conductive layer 170 and a transparent insulating layer 190 arranged between the p-type semiconductor layer 160 and the transparent conductive layer 170. Here, the transparent insulating layer 190 is arranged at a position beneath the p-side electrode 300 in the cross-sectional view shown in FIG. 2. In addition, the p-side electrode 300 includes an extending portion 310 that is formed linearly from an end portion thereof along a top surface of the transparent conductive layer 170.

Further, the semiconductor light emitting element 1 includes an n-side electrode 400 laminated on part of a semiconductor layer exposure surface 140a of the n-type semiconductor layer 140, which is exposed by cutting out part of each of the p-type semiconductor layer 160, light emitting layer 150 and n-type semiconductor layer 140 of the laminated semiconductor layer 100. It should be noted that, in the semiconductor layer exposure surface 140a, the n-contact layer 141 in the n-type semiconductor layer 140 is exposed.

The semiconductor light emitting element 1 further includes a protecting layer 180 laminated to cover a region of the transparent conductive layer 170 on which the p-side electrode 300 is not attached, a region of the p-electrode 300 except for a part, a region of the semiconductor layer exposure surface 140a on which the n-side electrode 400 is not attached, and a region of the n-side electrode 400 except for a part. It should be noted that the protecting layer 180 also covers wall surfaces of the n-type semiconductor layer 140, the light emitting layer 150 and the p-type semiconductor layer 160 that have been exposed by cutting out a part of each of the p-type semiconductor layer 160, the light emitting layer 150 and the n-type semiconductor layer 140.

When a voltage in which the p-side electrode 300 is at the high potential and the n-side electrode 400 is at the low potential (a forward voltage VF) is applied to the semiconductor light emitting element 1, in the semiconductor light emitting element 1, a current (a forward current IF) passes from the p-side electrode 300 toward the n-side electrode 400 through the p-type semiconductor layer 160, the light emitting layer 150 and the n-type semiconductor layer 140, and thereby light of the target wavelength (in this specific example, blue light) is outputted from the light emitting layer 150. Then, the light outputted from the light emitting layer 150 is outputted to the outside of the semiconductor light emitting element 1. It should be noted that the semiconductor light emitting element 1 of the exemplary embodiment is a light emitting diode of the face-up type in which the light outputted from the light emitting layer 150 is extracted from the side on which the p-side electrode 300 and the n-side electrode 400 are formed.

Next, each component of the semiconductor light emitting element 1 will be described. It should be noted that, in the following description, AlGaN, GaN and GaInN as specific examples of a group III nitride semiconductor are described with the compositional ratio of each element being omitted in some cases.

(Substrate 110)

A material of the substrate 110 can be selected from various kinds of materials without any limitation. For example, sapphire, SiC, silicon, GaN or the like can be used. Of these, it is particularly preferable to use a sapphire substrate whose C-plane is a principal plane. In the case where the sapphire substrate is used as the substrate 110, it is preferable to form the intermediate layer 120 (the buffer layer) on the C-plane of the sapphire.

(Laminated Semiconductor Layer 100)

The laminated semiconductor layer 100 is composed of, for example, a group III nitride semiconductor, which is configured by laminating the intermediate layer 120, the base layer 130, the n-type semiconductor layer 140, the light emitting layer 150 and the p-type semiconductor layer 160 on the substrate 110 in this order as shown in FIG. 2. Here, in the n-type semiconductor layer 140, an electron is a carrier, while in the p-type semiconductor layer 160, a hole is a carrier.

Hereinafter, each of the layers constituting the laminated semiconductor layer 100 will be described in order.

[Intermediate Layer 120]

The intermediate layer 120 has a function of mediating the difference in lattice constant between the substrate 110 and the base layer 130, and especially in the case where the substrate 110 is composed of a sapphire whose C-plane is a principal plane, serves to facilitate the formation of a single crystal layer which is C-axis oriented on the (0001) plane (the C-plane) of the substrate 110. The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$). The thickness of the intermediate layer 120 can be 10 nm to 500 nm. It should be noted that the intermediate layer 120 with excellent crystallinity can be obtained by forming by an MOCVD method. Moreover, a sputtering method under optimized conditions can form a semiconductor layer having more excellent crystallinity than that formed by the MOCVD method.

[Base Layer 130]

As the base layer 130, $Al_xGa_yIn_zN$ ($0 \leq x \leq 1$, $0 \leq y \leq 1$, $0 \leq z \leq 1$, $x+y+z=1$) can be used. Moreover, it is preferable to use $Al_xGa_{1-x}N$ ($0 \leq x < 1$) because the base layer 130 with excellent crystallinity can be formed.

The thickness of the base layer 130 is preferably 100 nm or more, more preferably 500 nm or more, and most preferably 1000 nm (1 μm) or more.

[N-Type Semiconductor Layer 140]

The n-type semiconductor layer 140, in which electrons are the carrier, includes the n-contact layer 141 laminated on the base layer 130 and the n-cladding layer 142, which is laminated on the n-contact layer 141 and on which the light emitting layer 150 is laminated. It should be noted that the above-described base layer 130 may be included in the n-type semiconductor layer 140.

The n-contact layer 141 is preferably configured with the $Al_xGa_{1-x}N$ layer ($0 \leq x < 1$, more preferably $0 \leq x \leq 0.5$, and still more preferably $0 \leq x \leq 0.1$). Moreover, the n-contact layer 141 is preferably doped with n-type impurities, and it is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-side electrode 400 can be maintained. As the n-type impurities, Si, Ge, Sn and so on are provided. The thickness of the n-contact layer 141 is preferably set to 500 nm to 5000 nm (5 μm), and more preferably set in a range of 1000 nm (1 μm) to 4000 nm (4 μm).

The n-cladding layer 142 performs injection of the carriers (the electrons here) into the light emitting layer 150 and confinement of the carriers, and in the exemplary embodiment, the n-cladding layer 142 is configured as a layer containing a superlattice structure in which n-first cladding layers and n-second cladding layers are alternately laminated. The thickness of the n-cladding layer 142 in total is preferably in the range of 5 nm to 500 nm, and more preferably in the range of 5 nm to 100 nm. The n-type impurity concentration of the n-cladding layer 142 is preferably in the range of $1.5 \times 10^{17}/cm^3$ to $1.5 \times 10^{20}/cm^3$, and more preferably in the range of $1.5 \times 10^{18}/cm^3$ to $1.5 \times 10^{19}/cm^3$.

[Light Emitting Layer 150]

In the exemplary embodiment, the light emitting layer 150 has a multiple quantum well structure in which well layers having small band gap energy and barrier layers having large band gap energy are alternately laminated. The number of pairs of the well layer and the barrier layer in the multiple quantum well structure (a set of the single well layer and the single barrier layer is assumed as one pair) is not less than 3, preferably 3 to 50, and more preferably 3 to 20. If the number of pairs is excessively large, usually, it is not preferable because productivity is deteriorated. The multiple quantum well structure will be described later.

As the well layer of the multiple quantum well structure, usually, a group III nitride semiconductor layer composed of $Ga_{1-y}In_yN$ ($0.1 < y < 0.3$) is used. The thickness of the well layer is the thickness by which quantum effects can be obtained, for example, 1 nm to 10 nm, and preferably 2 nm to 6 nm in terms of light emission output.

Moreover, in the exemplary embodiment, in the light emitting layer 150 of the multiple quantum well structure, it is preferable that the above-described $Ga_{1-y}In_yN$ is employed as the well layer and GaN having band gap energy larger than that of the well layer is employed as the barrier layer. The well layer and the barrier layer may be doped or not doped with impurities depending upon a design thereof. It should be noted that, in the exemplary embodiment, the light emitting layer 150 is configured to output blue light (light emission wavelength of the order of $\lambda = 400$ nm to 465 nm).

[P-Type Semiconductor Layer 160]

The p-type semiconductor layer 160, in which holes are the carrier, includes the p-cladding layer 161 laminated on the light emitting layer 150 and the p-contact layer 162, which is laminated on the p-cladding layer 161 and on which the transparent conductive layer 170 is laminated.

The p-cladding layer 161 performs injection of the carriers (the holes here) into the light emitting layer 150 and confinement of carriers within the light emitting layer 150. As the p-cladding layer 161, $Al_xGa_{1-x}N$ ($0 < x \leq 0.4$) can be preferably used. The thickness of the p-cladding layer 161 is preferably 1 nm to 400 nm, and more preferably 5 nm to 100 nm. The p-type impurity concentration in the p-cladding layer 161 is preferably $1\times10^{18}/cm^3$ to $1\times10^{21}/cm^3$, and more preferably $1\times10^{19}/cm^3$ to $1\times10^{20}/cm^3$.

The p-contact layer 162 is a layer for providing the transparent conductive layer 170. The p-contact layer 162 is preferably composed of $Al_xGa_{1-x}N$ ($0\leq x\leq 0.4$). The p-type impurity concentration in the p-contact layer 162 is preferably $1\times10^{18}/cm^3$ to $1\times10^{21}/cm^3$, and more preferably $1\times10^{19}/cm^3$ to $5\times10^{20}/cm^3$. As the p-type impurities in the p-cladding layer 161 and the p-contact layer 162, for example, Mg can be used. The thickness of the p-contact layer 162 is not particularly limited, but is preferably 10 nm to 500 nm, and more preferably 50 nm to 200 nm.

(Transparent Insulating Layer 190)

In the exemplary embodiment, the transparent insulating layer 190 is laminated on a part on the p-type semiconductor layer 160. As shown in FIG. 1, when the semiconductor light emitting element 1 is viewed in the planar view, the transparent insulating layer 190 is formed at a portion positioned beneath the p-side electrode 300.

As a material for constituting the transparent insulating layer 190, for example, metal oxides or nitrides such as $SiO_2$ (silicon dioxide), SiN (silicon nitride), $Al_2O_3$ (aluminum oxide) and titanium oxide are provided. In addition, a multilayered film structure of these layers for increasing a reflectance is also preferable.

The thickness of the transparent insulating layer 190 is usually 20 nm to 500 nm, and more desirably, 50 nm to 300 nm.

(Transparent Conductive Layer 170)

In the exemplary embodiment, the transparent conductive layer 170 (for example, indicated by the broken line in FIG. 1) is formed to cover almost all of the top surface of the p-type semiconductor layer 160, part of which has been removed by means of etching or the like so as to form the n-side electrode 400.

The transparent conductive layer 170 is configured with a conductive oxide containing In, and specific examples of conductive oxides containing In include: ITO (indium tin oxide ($In_2O_3$—$SnO_2$)); IZO (indium zinc oxide ($In_2O_3$—ZnO)); IGO (indium gallium oxide ($In_2O_3$—$Ga_2O_3$)); and ICO (indium cerium oxide ($In_2O_3$—$CeO_2$)). The thickness of the transparent conductive layer 170 is not particularly limited, but is in the range of, for example, 10 nm to 500 nm.

(Protecting Layer 180)

In the exemplary embodiment, the protecting layer 180 is configured with $SiO_2$. However, the material constituting the protecting layer 180 is not limited thereto, and $TiO_2$, $Si_3N_4$, $SiO_2$—$Al_2O_3$, $Al_2O_3$, AlN or the like may be employed in place of $SiO_2$.

(P-Side Electrode 300)

In the exemplary embodiment, the p-side electrode 300 is configured by laminating several kinds of metal layers, and when the semiconductor light emitting element 1 is viewed in a planar view as shown in FIG. 1, the p-side electrode 300 is configured to have a circular shape. Moreover, for uniformly supplying the current to the light emitting layer 150, the extending portion 310 having a thin line shape is provided to the p-side electrode 300. The extending portion 310 can be designed in a suitable shape, length, thickness or number thereof in accordance with the size or shape of the light emitting layer 150.

(N-Side Electrode 400)

Similar to the p-side electrode 300, the n-side electrode 400 is configured by laminating several kinds of metal layers. The n-side electrode 400 of the exemplary embodiment also serves as a so-called bonding pad, and a not-shown bonding wire is connected to a surface exposed to the outside. In the exemplary embodiment, in a planar view as shown in FIG. 1, the n-side electrode 400 is configured to show a semicylindrical shape; however, similar to the p-side electrode 300 as described above, it is possible to select any shape such as a circle or a polygon.

(Multiple Quantum Well Structure)

Figure 3:
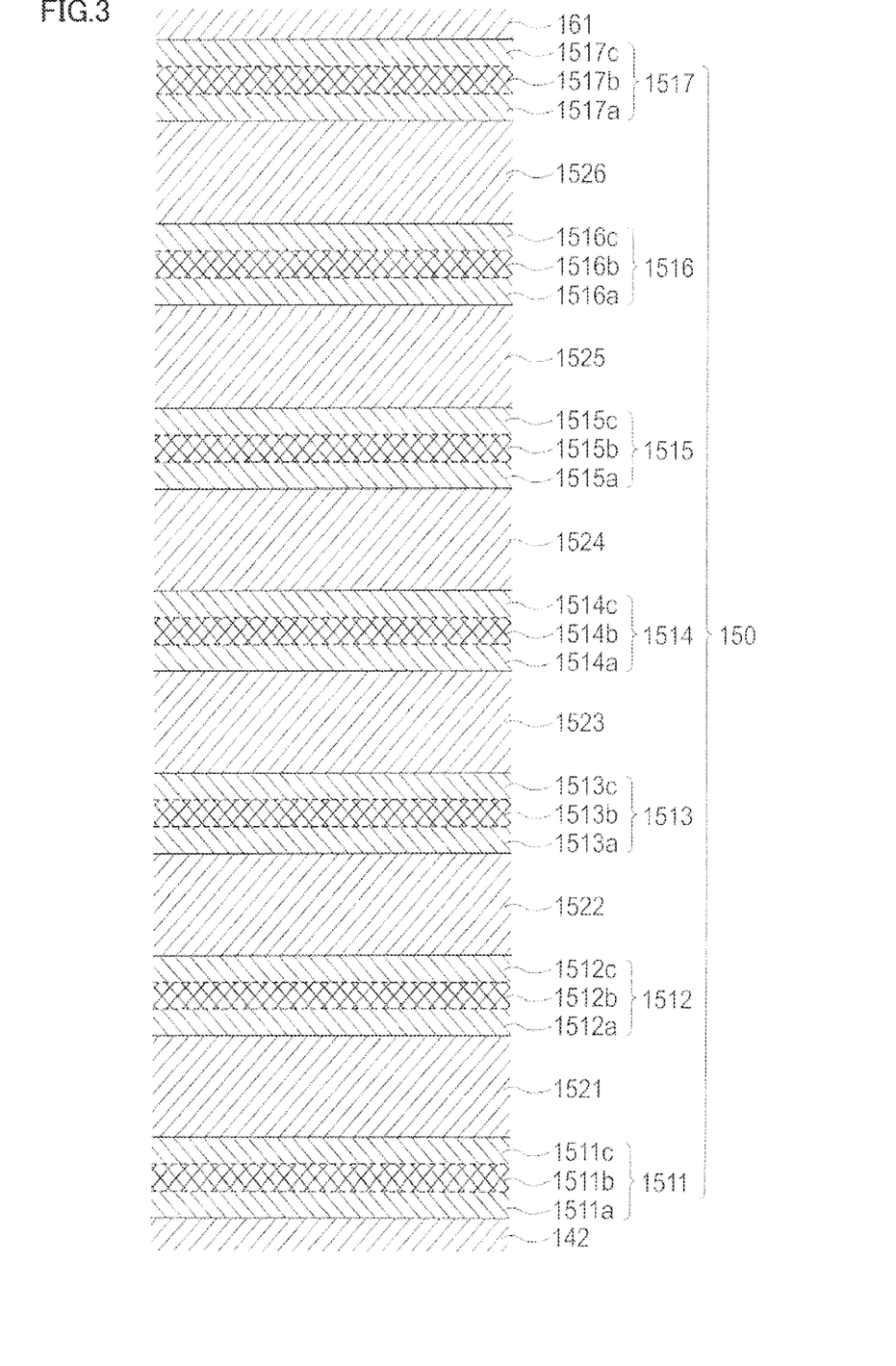
FIG. 3 is a cross-sectional view for illustrating a structure of a light emitting layer configured with a multiple quantum well structure.

FIG. 3 is a cross-sectional view for illustrating the structure of the light emitting layer 150 configured with a multiple quantum well structure.

In the exemplary embodiment, the light emitting layer 150 has a multiple quantum well structure in which barrier layers and well layers are alternately laminated. As shown in FIG. 3, the light emitting layer 150 includes: a first barrier layer 1511 laminated on the n-cladding layer 142 (more specifically, the n-first cladding layer); a first well layer 1521 laminated on the first barrier layer 1511; a second barrier layer 1512 laminated on the first well layer 1521; a second well layer 1522 laminated on the second barrier layer 1512; a third barrier layer 1513 laminated on the second well layer 1522; a third well layer 1523 laminated on the third barrier layer 1513; a fourth barrier layer 1514 laminated on the third well layer 1523; a fourth well layer 1524 laminated on the fourth barrier layer 1514; a fifth barrier layer 1515 laminated on the fourth well layer 1524; a fifth well layer 1525 laminated on the fifth barrier layer 1515; a sixth barrier layer 1516 laminated on the fifth well layer 1525; a sixth well layer 1526 laminated on the sixth barrier layer 1516; and a seventh barrier layer 1517 laminated on the sixth well layer 1526, on which the p-cladding layer 161 is laminated.

In this manner, the light emitting layer 150 of the exemplary embodiment is configured with 13 layers including 7 barrier layers (the first barrier layer 1511 to the seventh barrier layer 1517) and 6 well layers (the first well layer 1521 to the sixth well layer 1526). Moreover, the light emitting layer 150 has a structure in which a single well layer is sandwiched by two barrier layers. Then, of the light emitting layer 150, on a side in contact with the n-type semiconductor layer 140 (the n-cladding layer 142), the first barrier layer 1511 is positioned, and on a side in contact with the p-type semiconductor layer 160 (the p-cladding layer 161), the seventh barrier layer 1517 is positioned.

The first well layer 1521 to the fifth well layer 1525 provided in order from a side closer to the n-type semiconductor layer 140 are a specific example of plural n-side well layers, and the sixth well layer 1526 on a side closer to the p-type semiconductor layer 160 is a specific example of a p-side well layer.

It should be noted that, in the following description, of the light emitting layer 150, the first barrier layer 1511, the second barrier layer 1512, the third barrier layer 1513, the fourth barrier layer 1514, the fifth barrier layer 1515, the sixth barrier layer 1516 and the seventh barrier layer 1517 are collectively referred to as a barrier layer 151 in some cases. Moreover, of the light emitting layer 150, the first well layer 1521, the second well layer 1522, the third well layer 1523, the fourth well layer 1524, the fifth well layer 1525 and the sixth well layer 1526 are collectively referred to as a well layer 152 in some cases.

In the exemplary embodiment, each of the seven barrier layers (the first barrier layer 1511 to the seventh barrier layer 1517) constituting the barrier layer 151 has a three-layer structure configured with an n-side low-temperature barrier layer grown at a first temperature (1511*a*, 1512*a*, 1513*a*, 1514*a*, 1515*a*, 1516*a* and 1517*a*), a high-temperature barrier layer grown on the n-side low-temperature barrier layer at a second temperature that is higher than the first temperature (1511*b*, 1512*b*, 1513*b*, 1514*b*, 1515*b*, 1516*b* and 1517*b*) and a p-side low-temperature barrier layer grown on the high-temperature barrier layer at a third temperature that is lower than the second temperature (1511*c*, 1512*c*, 1513*c*, 1514*c*, 1515*c*, 1516*c* and 1517*c*). By making the barrier layer 151 have such a three-layer structure, high light emission intensity can be obtained compared to a case where no three-layer structure is provided.

Description of a method of manufacturing the barrier layer 151 and the well layer 152 will be given later.

(V-Shaped Concave Portion 150V)

Figure 4:
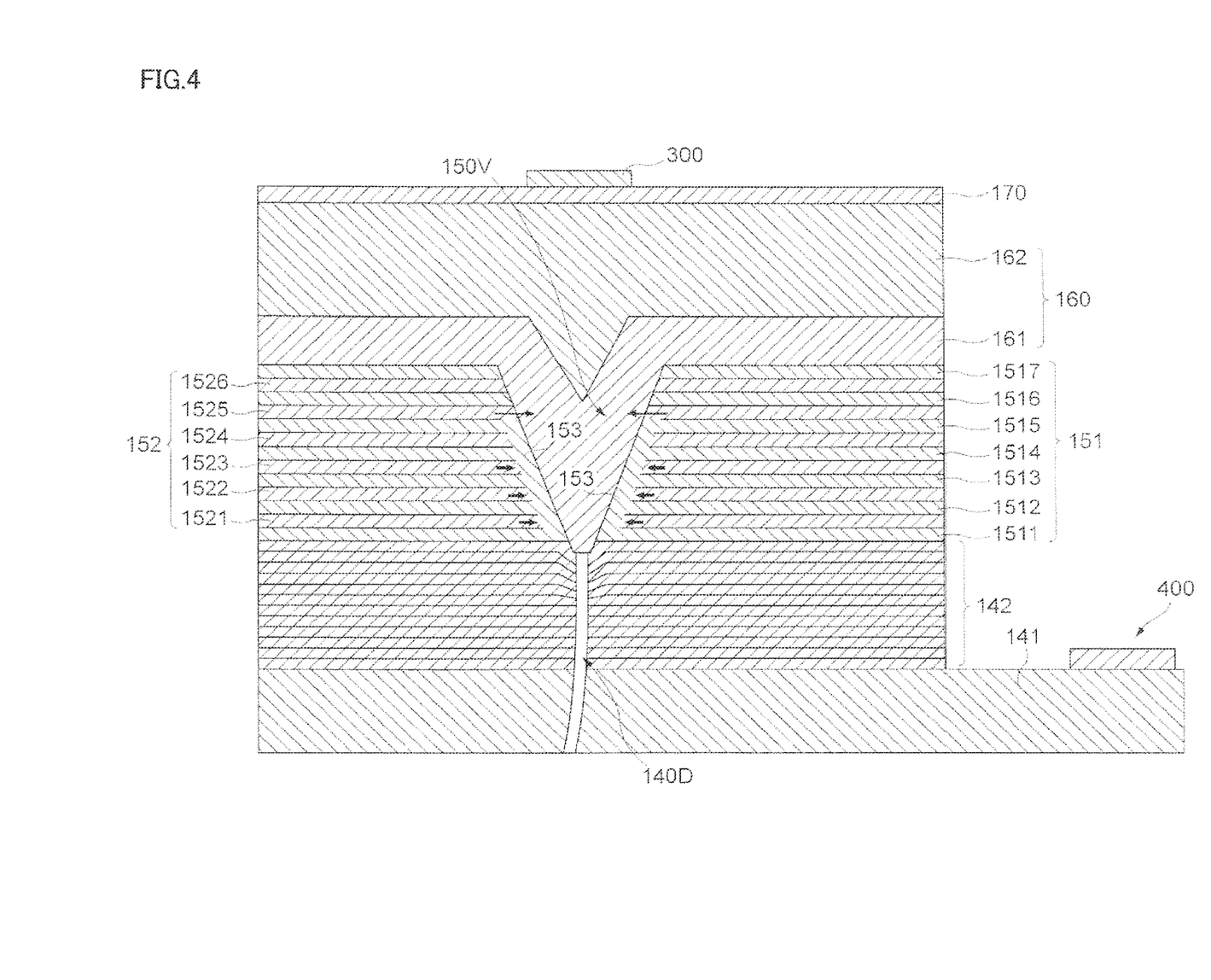
FIG. 4 is a cross-sectional view for illustrating a periphery of a V-shaped concave portion generated in the light emitting layer.

FIG. 4 is a cross-sectional view for illustrating a periphery of the V-shaped concave portion 150V generated in the light emitting layer 150. Same symbols are used for the portions similar to those in FIGS. 1 to 3, and descriptions thereof are omitted. It should be noted that, in FIG. 4, the protecting layer 180, the transparent insulating layer 190, the substrate 110, the intermediate layer 120 and the base layer 130 are omitted.

As shown in FIG. 4, the light emitting layer 150 laminated on the n-cladding layer 142 has the multiple quantum well structure in which the well layers having small band gap energy and the barrier layers having large band gap energy are alternately laminated. In the exemplary embodiment, in the light emitting layer 150, there is generated a V-shaped concave portion 150V that is constituted by concave portion inclined surfaces 153 and opened toward the p-cladding layer 161 side of the p-type semiconductor layer 160.

In the exemplary embodiment, the V-shaped concave portion 150V generated in the light emitting layer 150 is formed resulting from, for example, the threading dislocation in the n-type semiconductor layer 140. In the case where a material of a hexagonal system, such as sapphire, is used as the substrate 110, the GaN-based semiconductor or the like is grown on the C-plane (0001-plane) of the substrate 110 or a surface having a desired off-angle with respect to the plane. In this manner, if the n-type semiconductor layer 140, such as the GaN-based semiconductor, is grown on a different kind of substrate, lots of threading dislocations 140D resulting from lattice misfit are formed in the n-type semiconductor layer 140. Then, in the light emitting layer 150 laminated on the n-type semiconductor layer 140, the V-shaped concave portion 150V, which is referred to as a V-pit, is formed resulting from the threading dislocation 140D generated in the n-type semiconductor layer 140 as a base.

As shown in FIG. 4, the well layer 152 is configured with the five n-side well layers (the first well layer 1521 to the fifth well layer 1525) and the single p-side well layer (the sixth well layer 1526). At least one n-side well layer is formed in the proximity of a surface in contact with the p-cladding layer 161 so that the concentration of atoms of In on the inclined surface is not more than 50% of the concentration of atoms of In existing in the same well layer, as will be described later.

In the semiconductor light emitting element having the V-pit formed in the light emitting layer thereof, since end portions of the plural well layers directly contact the p-type semiconductor layer on the inclined surfaces of the V-pit, electrical resistance in the proximity of the inclined surfaces of the V-pit is reduced.

In the exemplary embodiment, in the semiconductor light emitting element 1 shown in FIG. 4, in a case where a voltage in which the n-side electrode 400 is at the high potential and the p-side electrode 300 is at the low potential (a reverse voltage) is applied, a reverse current (IR) that is to flow from the n-cladding layer 142 to the p-cladding layer 161 is reduced compared to a case where the n-side well layer in which the concentration of atoms of In on the concave portion inclined surfaces 153 is not more than 50% of the concentration of atoms of In existing in the well layer is not provided.

This is considered to be a fact that, if the concentration of atoms of In of the well layer 152 on the concave portion inclined surfaces 153 is reduced to 50% or less, the band gap energy of the end portion of the well layer 152 in which the atoms of In are reduced becomes large, and accordingly, increase of the reverse current (IR) that is to flow from the well layer 152 to the p-cladding layer 161 is inhibited.

In the exemplary embodiment, in the proximity of the surface of the well layer 152 to be in contact with the p-cladding layer 161, the end portions of the first well layer 1521 to the fifth well layer 1525, which are the n-side well layers, on the concave portion inclined surfaces 153 in which the concentration of atoms of In is reduced particularly have large effect of reducing the reverse current (IR), compared to the end portion of the sixth well layer 1526, which is the p-side well layer.

Figure 5A:
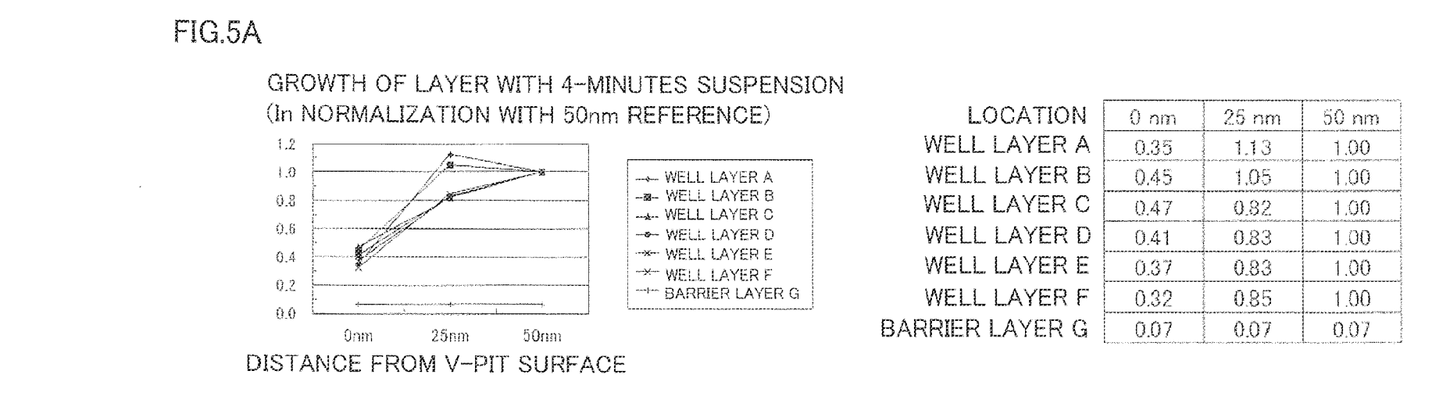
FIGS. 5A and 5B are graphs and tables for explaining concentration of atoms of In in the periphery of the V-shaped concave portion.
Figure 5B:
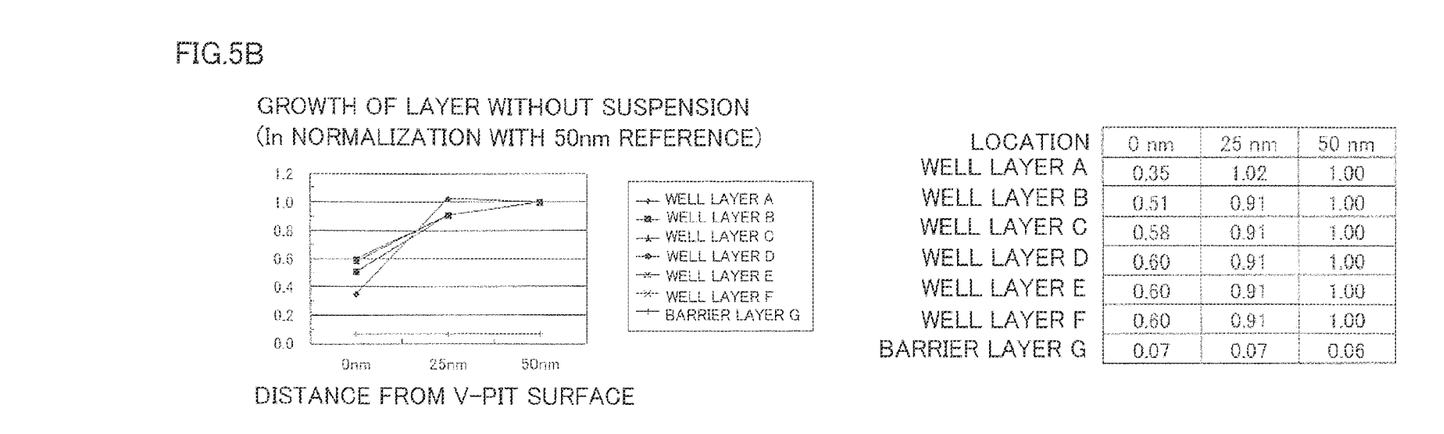

FIGS. 5A and 5B are graphs and tables for explaining the concentration of atoms of In in the periphery of the V-shaped concave portion 150V. FIG. 5A indicates the concentration of atoms of In in the periphery of the V-shaped concave portion 150V in the light emitting layer 150 manufactured by a manufacturing method (growth is suspended for four minutes), which will be described later. The horizontal axis (a distance from the V-pit) represents a distance from the surface to the inside of the V-shaped concave portion 150V in the well layer 152 of the multiple quantum well structure in a direction parallel to the substrate surface (unit: nm). The vertical axis represents the concentration of atoms of In in the above-described six well layers (the first well layer 1521 to the sixth well layer 1526, refer to FIG. 3). In the exemplary embodiment, values normalized with reference to the concentration of atoms of In (1.0) at the location of 50 nm from the surface of the V-shaped concave portion 150V are shown (In normalization with 50 nm reference).

It should be noted that, in FIG. 5A, the six well layers are represented as a well layer A to a well layer F in order from the p-cladding layer 161 side, and the well layer A, the well layer B, the well layer C, the well layer D, the well layer E and the well layer F correspond to the sixth well layer 1526, the fifth well layer 1525, the fourth well layer 1524, the third well layer 1523, the second well layer 1522 and the first well layer 1521, respectively. Moreover, for purpose of comparison, the concentration of atoms of In in the barrier layer 151 is also shown (the barrier layer G).

It should be noted that, as the atoms of In in the barrier layer 151, values normalized by an average value of the concentrations of atoms of In at the locations of 50 nm in the well layer A to the well layer F are shown. Even in a case where the barrier layer 151 is formed by GaN not containing In, since In in the adjacent well layer 152 is diffused, it is considered that the concentration of atoms of In becomes of the order of several % in the normalized value.

As shown in FIG. 5A, of the six well layers, the well layer A to the well layer F, that constitute the well layer 152 of the multiple quantum well structure, in all the layers of the well layer B to the well layer F, which are the n-side well layers, the concentration of atoms of In existing at the inclined surface portions of the V-shaped concave portion 150V (the distance from the surface of the V-pit is 0 nm) is not more than 50% of the concentration of atoms of In at the location of 50 nm from the surface of the V-shaped concave portion 150V (not more than 0.5 in the normalized value). Moreover, of the n-side well layers, in the four layers of the well layer B, the well layer D, the well layer E and the well layer F, the concentration of atoms of In at the inclined surface portions of the V-shaped concave portion 150V (the distance from the surface of the V-pit is 0 nm) is not more than 45% of the concentration of atoms of In at the location of 50 nm from the surface of the V-shaped concave portion 150V (not more than 0.45 in the normalized value). Further, of the n-side well layers, in the two layers of the well layer E and the well layer F, the concentration of atoms of In at the inclined surface portions of the V-shaped concave portion 150V (the distance from the surface of the V-pit is 0 nm) is not more than 40% of the concentration of atoms of In at the location of 50 nm from the surface of the V-shaped concave portion 150V (not more than 0.4 in the normalized value).

Moreover, of the n-side well layers, in the four layers of the well layer C to the well layer F, the concentration of atoms of In existing at the location of 25 nm from the inclined surface (the distance from the surface of the V-pit is 25 nm) is not more than 90% of the concentration of atoms of In at the location of 50 nm from the surface of the V-shaped concave portion 150V (not more than 0.9 in the normalized value).

On the other hand, FIG. 5B shows the concentration of atoms of In in the periphery of the V-shaped concave portion 150V in a case where the concentration of atoms of In at the inclined surface portions (the distance from the surface of the V-pit is 0 nm) is not 50% or less (0.5 or less in the normalized value) of the concentration of atoms of In at the location of 50 nm from the surface of the V-shaped concave portion 150V. To configurations similar to those in FIG. 5A, the same symbols are assigned.

As shown in FIG. 5B, it is learned that, of the six well layers, the well layer A to the well layer F, that constitute the well layer 152 of the multiple quantum well structure, in the well layer B to the well layer F, which are the n-side well layers, the concentration of atoms of In existing at the inclined surface portions of the V-shaped concave portion 150V (the distance from the surface of the V-pit is 0 nm) stays at a value more than 50% (normalized value 0.5) of the concentration of atoms of In at the location of 50 nm from the surface of the V-shaped concave portion 150V. In this case, if a reverse voltage is applied to the semiconductor light emitting element 1, the reverse current (IR) is increased.

Figure 6:
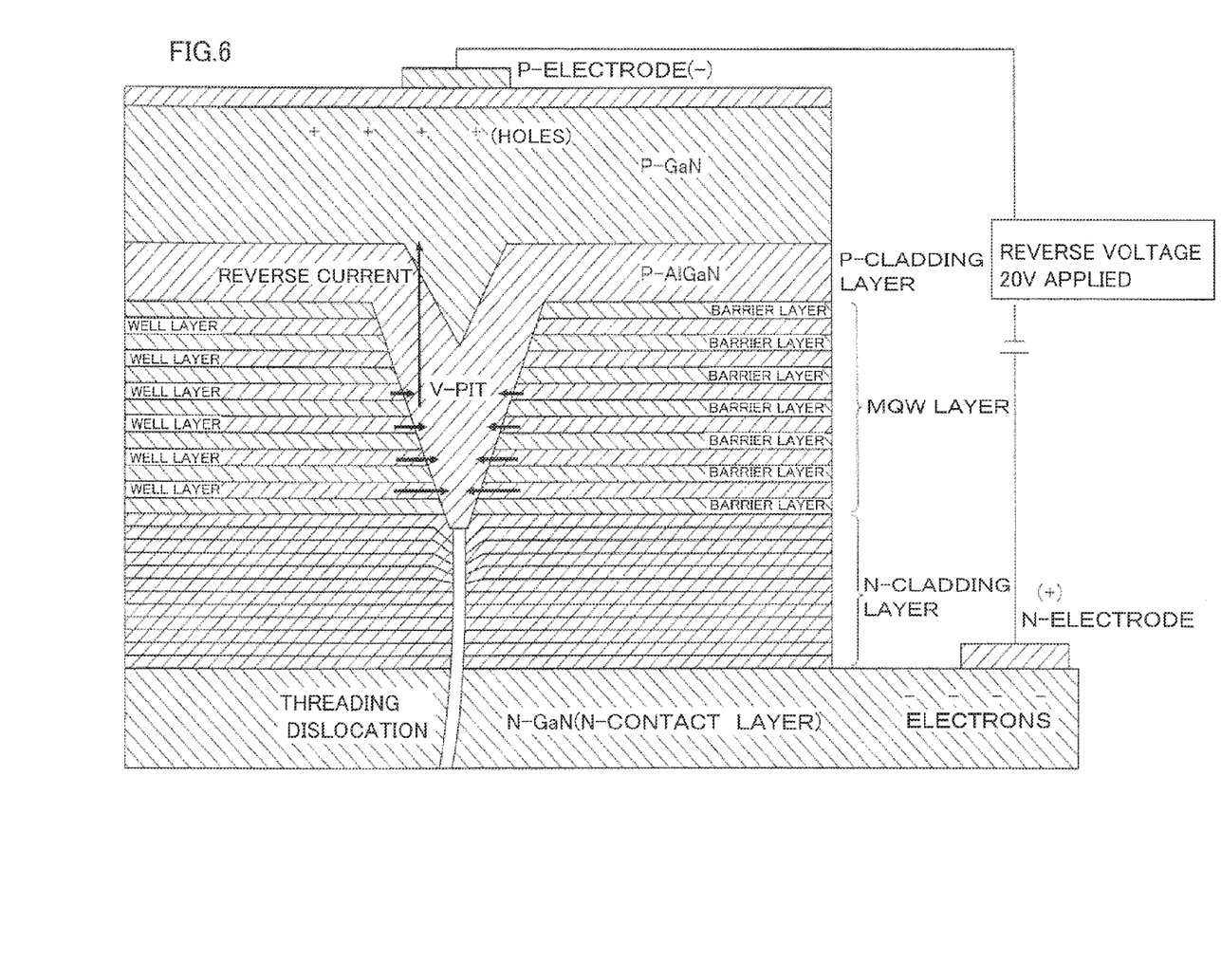
FIG. 6 is a diagram for illustrating a mechanism of occurrence of a reverse current in the V-shaped concave portion resulting from threading dislocation.

FIG. 6 is a diagram for illustrating a mechanism of occurrence of a reverse current (IR) in the V-shaped concave portion resulting from the threading dislocation. In a semiconductor light emitting element shown in FIG. 6, similar to the semiconductor light emitting element 1 shown in FIGS. 1 and 2, not-shown substrate, intermediate layer and base layer, n-GaN (the n-contact layer 141) laminated on the base layer, an N-cladding layer (the n-cladding layer 142), the light emitting layer 150 configured with a multiple quantum well structure (an MQW layer) alternately laminating the well layers 152 and the barrier layers 151, a P-cladding layer composed of P—AlGaN laminated on the light emitting layer 150 (the p-cladding layer 161) and P—GaN (the p-contact layer 162) are laminated, and a P-electrode (the p-side electrode 300) attached to an upper portion of the semiconductor light emitting element and an N-electrode (the n-side electrode 400) laminated on part of the n-GaN (the n-contact layer 141) are provided. As shown in FIG. 6, in the light emitting layer 150 configured with the MQW layer, a V-pit resulting from a threading dislocation in the n-GaN (the n-contact layer 141) and the N-cladding layer (the n-cladding layer 142) is generated.

In the semiconductor light emitting element shown in FIG. 6, in the case where a voltage in which the N-electrode is at the high potential and the P-electrode is at the low potential (a reverse voltage: 20V applied) is applied, a reverse current (IR) is apt to flow from the well layer in the MQW layer to the P-cladding layer in the V-pit.

The reason of this is considered that, since an end portion of the well layer of the MQW layer is exposed at the P-cladding layer where the V-pit is buried, to thereby cause the well layer to contact the P-cladding layer, the reverse current (IR) flows from the well layer to the P-cladding layer. The reverse current particularly has a tendency to flow from the well layer closer to the N-cladding layer.

<Method of Manufacturing Semiconductor Light Emitting Element>

Next, description will be given of a method of manufacturing the semiconductor light emitting element 1.

The method of manufacturing the semiconductor light emitting element having the light emitting layer 150 configured with the multiple quantum well structure includes: a first process in which the n-type semiconductor layer 140 is laminated on the substrate 110; a second process in which, on the n-type semiconductor layer 140, the light emitting layer 150 configured with the multiple quantum well structure that alternately laminates the barrier layers 151 and the well layers 152 containing GaInN, and having the V-shaped concave portion 150V resulting from the threading dislocation 140D generated in the n-type semiconductor layer 140 is laminated by a metal organic chemical vapor deposition method (an MOCVD method); and a third process in which the p-type semiconductor layer 160 is laminated on the light emitting layer 150.

(First Process)

First, on the substrate 110 composed of sapphire or the like, the intermediate layer 120 and the base layer 130 are successively laminated by, for example, the MOCVD method. Next, on the base layer 130, the n-contact layer 141 and the n-cladding layer 142 of the n-type semiconductor layer 140 are laminated. When the n-type semiconductor layer 140 is grown, it is preferable to set the temperature of the substrate 110 in a range of 900° C. to 1200° C. in a hydrogenous atmosphere. As a raw material for growing the n-contact layer 141, organic metal materials of a group III metal, such as trimethylgallium (TMG), and nitrogen materials, such as ammonia ($NH_3$), are used. The pressure in the MOCVD method is preferably set at 15 kPa to 80 kPa, and more preferably set at 15 kPa to 60 kPa. As a carrier gas, a nitrogen gas, a hydrogen gas or a mixed gas of the nitrogen gas and the hydrogen gas is used.

(Second Process)

Subsequently, the light emitting layer 150 is laminated on the n-type semiconductor layer 140. In the exemplary embodiment, the barrier layers 151 and the well layers 152 are alternately and repeatedly laminated to form the light emitting layer 150. At this time, it is preferable to laminate these layers so that the barrier layers 151 are provided to face the n-type semiconductor layer 140 and the p-type semiconductor layer 160.

In the exemplary embodiment, in the above-described first process, by growing the n-type semiconductor layer 140 composed of GaN-based semiconductor or the like on the substrate 110 composed of sapphire or the like, lots of threading dislocations 140D are formed resulting from the lattice misfit (refer to FIG. 4). Then, in the light emitting layer 150 laminated on the n-type semiconductor layer 140, resulting from the threading dislocations 140D generated in the n-type semiconductor layer 140 as a base, the V-shaped concave portions 150V, which are referred to as V-pits, are formed (refer to FIG. 4).

In the exemplary embodiment, as the well layer 152 of the multiple quantum well structure, in a case of a configuration showing blue light emission, a group III nitride semiconductor having a composition of $Ga_{1-y}In_yN$ ($0.07<y<0.2$) is usually used. Moreover, in a case of the well layer 152 showing green light emission, a group III nitride semiconductor in which composition of indium is increased, such as $Ga_{1-y}In_yN$ ($0.1<y<0.3$), is used. It should be noted that the composition or layer thickness of the barrier layer 151 and the well layer 152 can be appropriately set to obtain a predetermined light emission wavelength. Moreover, when the light emitting layer 150 is grown, the nitrogen gas can be used as the carrier gas.

In the exemplary embodiment, in the case of the light emitting layer 150 having the multiple quantum well structure, it is preferable to employ $Ga_{1-y}In_yN$ as the well layer 152 and employ $Ga_{1-x}N$ ($0\le x<0.3$), which has band gap energy larger than that of the well layer 152, as the barrier layer 151. Moreover, the barrier layer 151 and the well layer 152 may or may not be doped with impurities.

Figure 7:
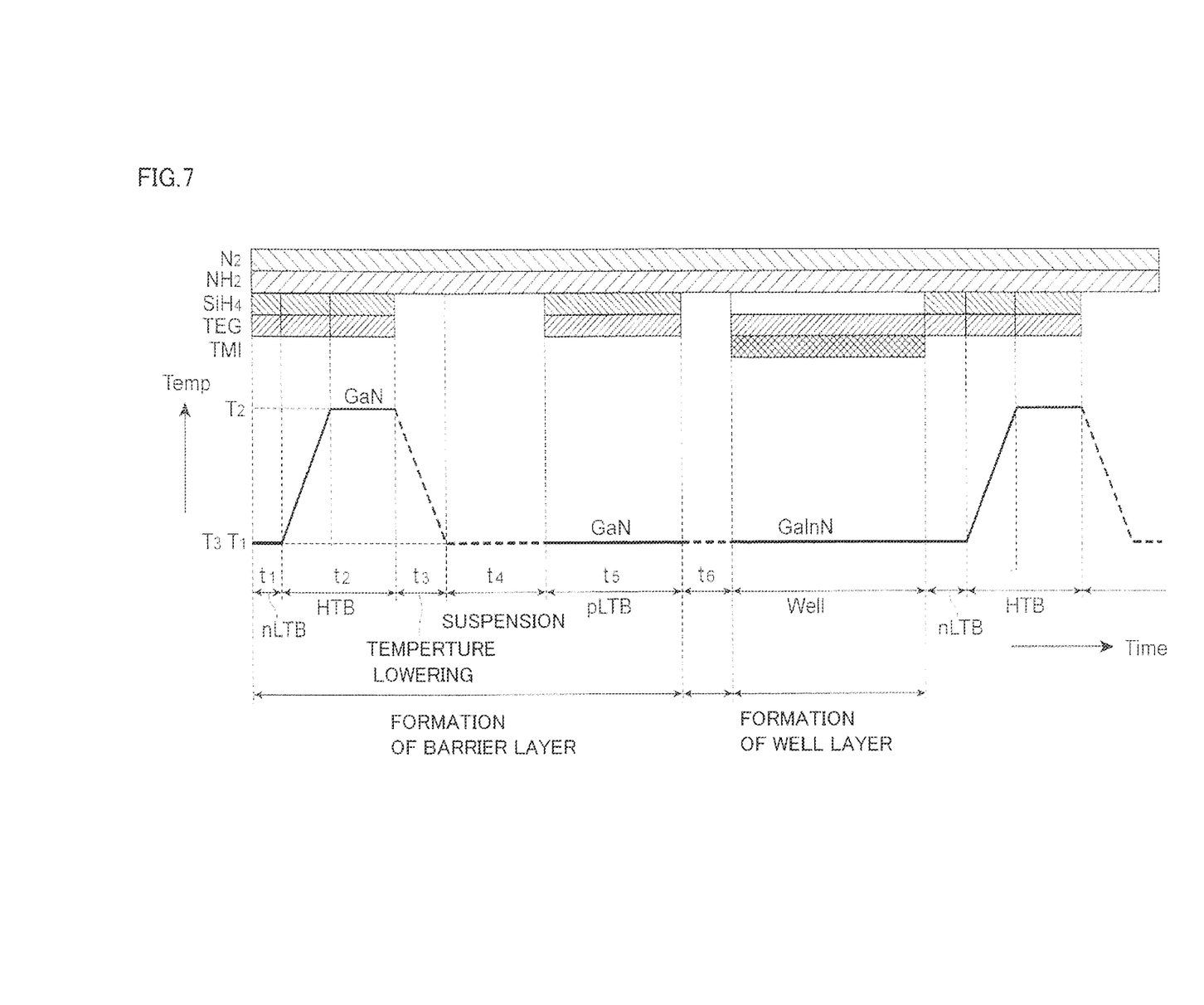
FIG. 7 is a graph showing a substrate temperature when the light emitting layer is formed in a method of manufacturing the semiconductor light emitting element in the exemplary embodiment.

FIG. 7 is a graph showing a substrate temperature when the light emitting layer 150 is formed in the method of manufacturing the semiconductor light emitting element 1 in the exemplary embodiment. In FIG. 7, the growth temperature and the growth time of the light emitting layer 150 (the barrier layers 151 and the well layers 152), and a specific example of conditions of gases to be supplied are shown. The vertical axis indicates the growth temperature (Temp) when each layer of the light emitting layer 150 is formed. The horizontal axis indicates the growth time (Time) when each layer of the light emitting layer 150 is formed. In the graph in FIG. 7, the solid line indicates the case where row materials are supplied, and the broken line indicates the case where supply of the raw materials is suspended.

As shown in FIG. 7, in the exemplary embodiment, first, when the barrier layer 151 is formed, the raw material is supplied to a metal organic chemical vapor deposition device (hereinafter, described as "MOCVD device"), to thereby grow an n-side low-temperature barrier layer (nLTB) at a first growth temperature ($T_1$). Next, while the raw material is continuously supplied to the MOCVD device, the substrate temperature is increased to a second growth temperature ($T_2$), which is higher than the first growth temperature ($T_1$), to thereby grow a high-temperature barrier layer (HTB) on the n-side low-temperature barrier layer (nLTB).

Subsequently, supply of the raw material to the MOCVD device is suspended, and the substrate temperature is lowered to a third growth temperature ($T_3$), which is lower than the above-described second growth temperature ($T_2$). In the exemplary embodiment, the first growth temperature ($T_1$) and the third growth temperature ($T_3$) are set to be equal. After the substrate temperature is lowered to the third growth temperature ($T_3$), further, while supply of the raw material remains suspended, the substrate 110 is maintained at the third growth temperature ($T_3$) for a time, which is at least 0.3 times as long as the time required to grow the n-side low-temperature barrier layer (nLTB), and thereby growth of the barrier layer 151 is suspended (suspension). Thereafter, supply of the raw material to the MOCVD device is restarted to continue growing a p-side low-temperature barrier layer (pLTB) on the high-temperature barrier layer (HTB), to thereby form the barrier layer 151 having the three-layer structure.

Thereafter, supply of the raw material is suspended to maintain the substrate 110 at the third growth temperature ($T_3$), then, supply of the raw material is restarted to grow the well layer (Well) on the p-side low-temperature barrier layer (pLTB), and further thereafter, an operation of laminating the barrier layer (nLTB, HTB and pLTB) on the well layer (Well) is repeated, to thereby form the light emitting layer 150 having the multiple quantum well structure.

At this time, it is preferable to set the first growth temperature ($T_1$: substrate temperature) in a range of 600° C. to 800° C. because, by doing so, excessive sublimation of indium (In) in the well layer 152 can be prevented. If the first growth temperature ($T_1$) is excessively low, crystallinity of the barrier layer 151 is decreased, and accordingly, there is a tendency to deteriorate light emission properties. On the other hand, if the first growth temperature ($T_1$) is too high, indium (In) in the well layer 152 under the barrier layer 151 is excessively sublimed, and accordingly, there is a tendency to deteriorate flatness of a surface.

The second growth temperature ($T_2$) is preferably set in a range of 800° C. to 1000° C. If the second growth temperature ($T_2$) is excessively low, redundancy of indium in the well layer 152 under the barrier layer 151 is not sublimed, and accordingly, there is a tendency to result in insufficient electrical properties of the semiconductor light emitting element 1. On the other hand, if the second growth temperature ($T_2$) is too high, indium in the well layer 152 under the barrier layer 151 excessively sublimes, and accordingly, there is a tendency to result in insufficient output of the semiconductor light emitting element 1.

It should be noted that, in the exemplary embodiment, while the group III raw material remains supplied, the substrate temperature is increased from the first growth temperature ($T_1$) to the second growth temperature ($T_2$). This brings a tendency to increase light emission intensity.

The third growth temperature ($T_3$) is preferably set in a range of 600° C. to 1000° C., and more preferably, lower than the second growth temperature ($T_2$) by at least 100° C. If the third growth temperature ($T_3$) is excessively low, crystallinity of the barrier layer 151 is decreased, and accordingly, there is a tendency to deteriorate light emission properties. On the other hand, if the third growth temperature ($T_3$) is excessively high, there is a tendency to deteriorate flatness of a surface of the barrier layer 151. Moreover, it is particularly preferable to set the third growth temperature ($T_3$) in a range of 700° C. to 800° C., which is close to the temperature for forming the well layer 152, from the viewpoint of a quest to stabilize the temperature in forming the well layer 152.

In the exemplary embodiment, when the barrier layer 151 is grown, organic metal materials of a group III metal, such as triethylgallium (TEG), is supplied as the raw material. In addition, at the same time, the raw material gases of ammonia ($NH_3$) and nitrogen ($N_2$) are supplied. There are some cases in which a raw material gas, such as monosilane (SiH4), is supplied for doping Si or the like. Moreover, in growing the well layer 152, triethylgallium (TEG) and trimethylindium (TMI) are supplied as the raw material, together with the ammonia ($NH_3$) and nitrogen ($N_2$) gases.

As described above, in the exemplary embodiment, after the high-temperature barrier layer (HTB) is grown at the second growth temperature ($T_2$), supply of the raw materials ($N_2$, $NH_2$, $SiH_4$, TEG and TMI) is suspended and the substrate temperature is lowered to the third growth temperature ($T_3$) that is lower than the second growth temperature ($T_2$). Then, further, while supply of the raw materials remains suspended, the substrate 110 is maintained at the third growth temperature ($T_3$) for a time, which is at least 0.3 times as long as the time required to grow the n-side low-temperature barrier layer (nLTB), and thereby growth of the barrier layer 151 is suspended (suspension).

Then, after supply of the raw materials is suspended and the substrate 110 is maintained at the third growth temperature ($T_3$), supply of the raw materials is restarted to grow the well layer (Well) on the p-side low-temperature barrier layer (pLTB).

It is considered this causes indium to be sublimed from the end portions of the well layers 152 exposed on the surface of the V-shaped concave portion 150V (refer to FIG. 4) in the light emitting layer 150, and accordingly, concave portion inclined surfaces 153, in which the concentration of atoms of In is reduced, are formed in proximity to the V-shaped concave portion 150V.

The time (t1) for growing the n-side low-temperature barrier layer (nLTB) at the first growth temperature ($T_1$), the time (t2) for increasing the substrate temperature to the second growth temperature ($T_2$) and growing the high-temperature barrier layer (HTB) on the n-side low-temperature barrier layer (nLTB), the time (t3) for suspending supply of the low materials to lower the substrate temperature from the second growth temperature ($T_2$) to the third growth temperature ($T_3$), the time (t4) for suspending the growth of the barrier layer 151 while continuing suspension of supply of the raw materials, the time (t5) for restarting supply of the raw materials to grow the p-side low-temperature barrier layer (pLTB) on the high-temperature barrier layer (HTB) at the third growth temperature ($T_3$) and the time (t6) for suspending supply of the raw materials to maintain the substrate 110 at the third growth temperature ($T_3$) are appropriately determined depending upon the thickness of the barrier layer 151, the growth temperature or the like, and there is no particular limitation.

In the exemplary embodiment, a condition in which t4 is at least 0.3 times as large as t1 (t4/t1≥0.3) is preferable because an effect of reducing the reverse current (IR) is especially excellent, and further, the condition in which t4 is at least 0.8 times as large as t1 is more preferable. In a case where t4 is excessively small compared to t1, it is not preferable because there is a tendency to deteriorate the effect of reducing the reverse current (IR).

Moreover, a condition in which a sum of t3 and t4 (t3+t4), which is the maintaining time, is at least 1.8 times as large as t1 ((t3+t4)/t1≥1.8) is preferable because the effect of reducing the reverse current (IR) is especially excellent, and further, the condition in which the sum of t3 and t4 (t3+t4) is at least 5 times as large as t1 is more preferable. In a case where the sum of t3 and t4 (t3+t4) is excessively small compared to t1, it is not preferable because there is a tendency to deteriorate the effect of reducing the reverse current (IR).

In the exemplary embodiment, t1 is preferably set in a range of 10 seconds to 120 seconds. In a case where t1 is excessively short, it is not preferable because inter diffusion between the well layer and the barrier layer at an interface thereof becomes remarkable and steepness of the interface becomes worse, to thereby bring a tendency to decrease light emission output. On the other hand, in a case where t1 is excessively long, it is not preferable because of a tendency to reduce productivity.

Moreover, t3 is preferably set in a range of 60 seconds to 180 seconds. In a case where t3 is excessively short, it is not preferable because there is a tendency to deteriorate the effect of reducing the reverse current (IR). On the other hand, in a case where t3 is excessively long, it is not preferable because of a tendency to reduce productivity.

Moreover, t4 is preferably set in a range of 30 seconds to 600 seconds. In a case where t4 is excessively short, it is not preferable because there is a tendency to deteriorate the effect of reducing the reverse current (IR). On the other hand, in a case where t4 is excessively long, it is not preferable because of a tendency to reduce productivity, though there is no problem in element properties.

(Third Process)

Next, the p-type semiconductor layer 160 is formed on the light emitting layer 150. The p-type semiconductor layer 160 is formed by successively laminating the p-cladding layer 161 and the p-contact layer 162.

Thereafter, the transparent insulating layer 190 is laminated on part of the p-type semiconductor layer 160 of the laminated semiconductor layer 100. Further, the transparent conductive layer 170 is formed to cover almost all of the top surface of the p-type semiconductor layer 160, part of which has been removed by means of etching or the like so as to form the n-side electrode 400. Subsequently, the p-side electrode 300 is laminated and part thereof other than a predetermined region is removed by means of, for example, photolithography. Subsequently, patterning is performed by means of photolithography, part of the laminated semiconductor layer 100 of a predetermined region is etched to expose part of the n-contact layer 141, to thereby form the semiconductor exposure surface 140a. Next, the n-side electrode 400 is formed on the semiconductor exposure surface 140a.

As described above, the semiconductor light emitting element 1 shown in FIG. 1 is manufactured.

EXAMPLES

Hereinafter, the present invention will be described further in detail with reference to Examples. However, the present invention is not limited to the following Examples as long as the scope of the gist thereof is not exceeded.

Examples 1 to 9, Comparative Examples 1 and 2

On the substrate 110 configured with a sapphire whose C-plane was a principal plane, by means of the MOCVD method, the intermediate layer 120 composed of AlN and the base layer 130 composed of GaN were laminated, and after that, on the base layer 130, the n-contact layer 141 and the n-cladding layer 142, which were composed of n-GaN with n-type impurities of Si, were laminated.

Subsequently, on the n-cladding layer 142, by means of the MOCVD method, the barrier layers 151 composed of GaN and the well layers 152 composed of GaInN were alternately and repeatedly laminated, to thereby laminate the light emitting layer 150 configured with 13 layers including 7 barrier layers 151 and 6 well layers 152. Each of the 7 barrier layers 151 was formed with the three-layer structure in which the n-side low-temperature barrier layer, the high-temperature barrier layer and the p-side low-temperature barrier layer ware successively laminated. The growth time (t1, t2 and t5) and the maintaining time (t3, t4 and t6) in forming the barrier layer 151 were set at the conditions shown in Table 1. It should be noted that the first growth temperature ($T_1$) was set at 700° C., the second growth temperature ($T_2$) was set at 900° C., and the third growth temperature ($T_3$) was set at 700° C., which is as same as the first growth temperature ($T_1$).

Next, by the MOCVD method, on the seventh barrier layer 1517, the p-cladding layer 161 composed of P—AlGaN with p-type impurities of Mg and the p-contact layer 162 composed of P—GaN with the p-type impurities of Mg were successively laminated. Subsequently, on part on the p-contact layer 162, the transparent insulating layer 190 composed of $SiO_2$ was laminated, and further, the transparent conductive layer 170 composed of IZO was formed to cover almost all of the top surface of the p-contact layer 162, part of which had been removed by means of etching so as to form the n-side electrode 400.

Subsequently, the p-side electrode 300 was laminated and part thereof other than a predetermined region was removed by means of photolithography. Further, patterning is performed by means of photolithography, part of the laminated semiconductor layer 100 of a predetermined region was etched to expose part of the n-contact layer 141 to form the semiconductor exposure surface 140a, and the n-side electrode 400 was formed on the semiconductor exposure surface 140a. As described above, various kinds of semiconductor light emitting elements having different barrier layers 151 were prepared.

It should be noted that, in each of the semiconductor light emitting elements of Examples 1 to 9 and Comparative Examples 1 and 2 shown in Table 1, the substrate 110, the intermediate layer 120, the base layer 130, the n-type semiconductor layer 140, the p-type semiconductor layer 160, the transparent conductive layer 170, the protecting layer 180, the transparent insulating layer 190, the p-side electrode 300 and the n-side electrode 400 were configured in common.

Moreover, the semiconductor light emitting element indicated in the table in FIG. 5A described in the above exemplary embodiment corresponds to Example 1, and the semiconductor light emitting element indicated in the table in FIG. 5B, which was compared to the table in FIG. 5A, corresponds to Comparative Example 1. It should be noted that, in Example 1 and Comparative Example 1, the thickness of each of the first barrier layer 1511 to the sixth barrier layer 1516 is 2.5 nm, the thickness of the seventh barrier layer 1517 is 4.5 nm, the thickness of each of the well layer B to the well layer F is 3.5 nm, and the thickness of the well layer A is 4.4 nm. The In composition of GaInN constituting the well layer was adjusted so that the light emission wavelength became 460 nm.

A reverse voltage of 20V was applied to each of the semiconductor light emitting elements in Examples 1 to 9 and Comparative Examples 1 and 2, and reverse currents (IR) were measured. These results are shown in Table 1.

Also in Examples 2 to 9, the concentration distribution of atoms of In in the n-side well layers had a tendency similar to Example 1, and in at least one n-side well layer, the concentration of atoms of In at the inclined surface was not more than 50% of the concentration of atoms of In existing in the same n-side well layer, and moreover, the concentration of atoms of In at the location of 25 nm from the inclined surface was not more than 90% of the concentration of atoms of In existing in the same n-side well layer.

On the other hand, the concentration distribution of atoms of In in the n-side well layers in Comparative Example 2 had a tendency similar to Comparative Example 1, that is, in each of the n-side well layers, the concentration of atoms of In existing at the inclined surface portions (the distance from the surface of the V-pit is 0 nm) was higher than 50% (normalized value 0.5) of the concentration of atoms of In at the location of 50 nm from the surface of the V-shaped concave portion 150V, and the concentration of atoms of In existing at the location of 25 nm from the inclined surface was also higher than 90% (normalized value 0.9) of the concentration of atoms of In existing at the n-side well layer.

The reverse current (IR) in Example 1 is 1.3 µA, which is lowered to not more than one tenth of 20 µA in Comparative Example 1, and accordingly, it can be learned that reverse current property is remarkably excellent. In each of Examples 2 to 9, the reverse current (IR) is less than 5 µA, and it can be learned that reverse current property is good, too. On the other hand, the reverse current (IR) in Comparative Example 2 is 7.2 µA, which is larger than 5 µA, and it can be learned that the reverse current property is inferior compared to any of Examples.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the prin-

TABLE 1

|  |  | t1 (sec) | t2 (sec) | t3 (sec) | t4 (sec) | t5 (sec) | t6 (sec) | t4/t1 | (t3 + t4)/t1 | IR (µA) |
|---|---|---|---|---|---|---|---|---|---|---|
| Example | 1 | 72 | 216 | 120 | 240 | 57 | 30 | 3.3 | 5.0 | 1.3 |
|  | 2 | 72 | 216 | 120 | 120 | 57 | 30 | 1.7 | 3.3 | 1.8 |
|  | 3 | 72 | 216 | 120 | 60 | 57 | 30 | 0.8 | 2.5 | 2.5 |
|  | 4 | 72 | 216 | 120 | 30 | 57 | 30 | 0.4 | 2.1 | 4.5 |
|  | 5 | 72 | 216 | 120 | 360 | 57 | 30 | 5.0 | 6.7 | 1.3 |
|  | 6 | 72 | 216 | 120 | 600 | 57 | 30 | 8.3 | 10.0 | 1.2 |
|  | 7 | 72 | 216 | 60 | 240 | 57 | 30 | 3.3 | 4.2 | 2.5 |
|  | 8 | 72 | 216 | 180 | 240 | 57 | 30 | 3.3 | 5.8 | 1.2 |
|  | 9 | 36 | 216 | 120 | 30 | 57 | 30 | 0.8 | 4.2 | 4.2 |
| Comparative | 1 | 72 | 216 | 120 | 0 | 57 | 30 | 0.0 | 1.7 | 20.0 |
| Example | 2 | 132 | 216 | 120 | 30 | 57 | 30 | 0.2 | 1.1 | 7.2 |

In all of the light emitting layers 150 in Examples 1 to 9 and Comparative Examples 1 and 2, the V-shaped concave portions 150V of similar surface density were generated. This is because a main cause of generation of the V-pits is the threading dislocations 140D generated in the n-type semiconductor layer 140. In Example 1 and Comparative Example 1, the normalized concentration of atoms of In in the n-side well layers existing at the locations of the inclined surfaces of the V-shaped concave portions 150V (the distance from the surface of the V-pit is 0 nm) and the normalized concentration of atoms of In existing at the locations of 25 nm from the inclined surfaces (the distance from the surface of the V-pit is 25 nm) are as shown in FIGS. 5A and 5B, respectively.

ciples of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
   an n-type semiconductor layer laminated on a substrate;
   a light emitting layer laminated on the n-type semiconductor layer and having a multiple quantum well structure in which a plurality of barrier layers and a plurality of well layers containing atoms of In are alternately laminated; and a p-type semiconductor layer laminated on the light emitting layer, wherein the light emitting layer includes three or more of the well layers and four or more of the barrier layers, each of the three or more well layers being sandwiched by the barrier layers from both sides, one of the four or more barrier layers being connected to the n-type semiconductor layer at an interface portion with the n-type semiconductor layer, and another one of the four or more barrier layers being connected to the p-type semiconductor layer at an interface portion with the p-type semiconductor layer, the three or more well layers include a plurality of n-side well layers provided in order from a side closer to the n-type semiconductor layer and one p-side well layer provided on a side closer to the p-type semiconductor layer, and a V-shaped concave portion, which is configured with inclined surfaces of a concave portion opened toward the p-type semiconductor layer, is generated in the light emitting layer, and in at least one of the n-side well layers, a concentration of atoms of In on the inclined surface is not more than 50% of a concentration of atoms of In existing in the same n-side well layer, wherein, in at least one of the n-side well layers, the concentration of atoms of In at a location of 25 nm from the inclined surface is not more than 90% of the concentration of atoms of In existing in the same n-side well layer.

2. The semiconductor light emitting element according to claim 1, wherein the light emitting layer includes six layers of the well layer configured with a group III nitride semiconductor and seven layers of the barrier layer configured with a group III nitride semiconductor having band gap energy larger than that in the well layer.

3. The semiconductor light emitting element according to claim 1, wherein the well layer is composed of $Ga_{1-y}In_yN$ ($0.1<y<0.3$) and the barrier layer is composed of GaN.

4. A semiconductor light emitting element comprising:
an n-type semiconductor layer laminated on a substrate;
a light emitting layer laminated on the n-type semiconductor layer and having a multiple quantum well structure in which a plurality of barrier layers and a plurality of well layers containing atoms of In are alternately laminated; and a p-type semiconductor layer laminated on the light emitting layer, wherein the light emitting layer includes three or more of the well layers and four or more of the barrier layers, each of the three or more well layers being sandwiched by the barrier layers from both sides, one of the four or more barrier layers being connected to the n-type semiconductor layer at an interface portion with the n-type semiconductor layer, and another one of the four or more barrier layers being connected to the p-type semiconductor layer at an interface portion with the p-type semiconductor layer, the three or more well layers include a plurality of n-side well layers provided in order from a side closer to the n-type semiconductor layer and one p-side well layer provided on a side closer to the p-type semiconductor layer, and a V-shaped concave portion, which is configured with inclined surfaces of a concave portion opened toward the p-type semiconductor layer, is generated in the light emitting layer, and in at least one of the n-side well layers, a concentration of atoms of In on the inclined surface is not more than 50% of a concentration of atoms of In existing in the same n-side well layer, wherein the concentration of atoms of In on the inclined surface in the n-side well layer is reduced on the inclined surface in one of the n-side well layers closest to the n-type semiconductor layer compared to the concentration of atoms of In on the inclined surface in one of the n-side well layers closest to the p-type semiconductor layer.

5. The semiconductor light emitting element according to claim 4, wherein the light emitting layer includes six layers of the well layer configured with a group III nitride semiconductor and seven layers of the barrier layer configured with a group III nitride semiconductor having band gap energy larger than that in the well layer.

6. The semiconductor light emitting element according to claim 4, wherein the well layer is composed of $Ga_{1-y}In_yN$ ($0.1<y<0.3$) and the barrier layer is composed of GaN.

7. A semiconductor light emitting element comprising:
an n-type semiconductor layer laminated on a substrate;
a light emitting layer laminated on the n-type semiconductor layer and having a multiple quantum well structure in which a plurality of barrier layers and a plurality of well layers containing atoms of In are alternately laminated; and a p-type semiconductor layer laminated on the light emitting layer, wherein the light emitting layer includes three or more of the well layers and four or more of the barrier layers, each of the three or more well layers being sandwiched by the barrier layers from both sides, one of the four or more barrier layers being connected to the n-type semiconductor layer at an interface portion with the n-type semiconductor layer, and another one of the four or more barrier layers being connected to the p-type semiconductor layer at an interface portion with the p-type semiconductor layer, the three or more well layers include a plurality of n-side well layers provided in order from a side closer to the n-type semiconductor layer and one p-side well layer provided on a side closer to the p-type semiconductor layer, and a V-shaped concave portion, which is configured with inclined surfaces of a concave portion opened toward the p-type semiconductor layer, is generated in the light emitting layer, and in at least one of the n-side well layers, a concentration of atoms of In on the inclined surface is not more than 50% of a concentration of atoms of In existing in the same n-side well layer, wherein the barrier layer has a three-layer structure including an n-side low-temperature barrier layer grown on the n-type semiconductor layer side at a first temperature, a high-temperature barrier layer grown on the n-side low-temperature barrier layer at a second temperature that is higher than the first temperature, and a p-side low-temperature barrier layer grown on the high-temperature barrier layer at a third temperature that is lower than the second temperature.

* * * * *